United States Patent [19]
Takeuchi et al.

[11] Patent Number: 5,744,826
[45] Date of Patent: Apr. 28, 1998

[54] SILICON CARBIDE SEMICONDUCTOR DEVICE AND PROCESS FOR ITS PRODUCTION

[75] Inventors: Yuichi Takeuchi, Chita-gun; Takeshi Miyajima, Kariya; Norihito Tokura, Okazaki; Hiroo Fuma, Ichinomiya; Toshio Murata, Seto, all of Japan

[73] Assignee: Denso Corporation, Kariya, Japan

[21] Appl. No.: 785,952

[22] Filed: Jan. 22, 1997

[30] Foreign Application Priority Data

Jan. 23, 1996 [JP] Japan .................. 8-009625

[51] Int. Cl.$^6$ .................. H01L 31/0312
[52] U.S. Cl. .................. 257/77; 257/328; 257/330; 438/931
[58] Field of Search .................. 257/77, 328, 330; 438/931

[56] References Cited

U.S. PATENT DOCUMENTS

| | | |
|---|---|---|
| 4,859,621 | 8/1989 | Einthoven . |
| 5,170,231 | 12/1992 | Fuji et al. . |
| 5,233,215 | 8/1993 | Baliga . |
| 5,323,040 | 6/1994 | Baliga . |
| 5,389,799 | 2/1995 | Uemoto . |
| 5,399,515 | 3/1995 | Davis et al. . |
| 5,506,421 | 4/1996 | Palmour .................. 257/77 |

FOREIGN PATENT DOCUMENTS

| | | |
|---|---|---|
| 656 661 | 6/1995 | European Pat. Off. . |
| 657 947 | 6/1995 | European Pat. Off. . |
| 657 992 | 6/1995 | European Pat. Off. . |
| 2-91976 | 3/1990 | Japan . |
| 4-239778 | 8/1992 | Japan . |
| 5-102497 | 4/1993 | Japan . |
| 7-131016 | 5/1995 | Japan . |

OTHER PUBLICATIONS

Proceeding of the 28th Intersociety Energy Conversion engineering Conference, vol. 1, Aug. 8, 1993, p. 1.249–1.254.

Inst. Phys. Conf. Ser. No. 137, Chapter 1, Paper presented at the 5th Sic and Related Materials Conf. Washington DC 1993 pp. 55–58.

Proceeding of 3rd Conference of SIC and Related Wide Gap Semiconductor Study Group. Oct. 27–28, 1994, p. 27.

Jap J. Appln. Phys., vol. 21, No. 4, Apr. 4, 1982, pp. 579–585.

Jap. J. Appln/Phys, vol. 34, Part 1, No. 10, Oct. 1995, pp 5567–5573.

B. Jayant Baliga, "Critical Nature of Oxide/Interface Quality For SiC Power Devices", Microelectronic Engineering, vol. 28, No. 1/04, Jul. 1995 pp. 177–184.

*Primary Examiner*—Sara W. Crane
*Assistant Examiner*—Douglas A. Wille
*Attorney, Agent, or Firm*—Cushman Darby & Cushman IP Group of Pillsbury Madison & Sutro LLP

[57] ABSTRACT

A semiconductor substrate 4 consisting of an n$^+$-type substrate 1, an n$^-$-type silicon carbide semiconductor layer 2 and a p-type silicon carbide semiconductor layer 3, made of hexagonal crystal-based single crystal silicon carbide with the main surface having a planar orientation approximately in the (000$\bar{1}$) carbon face. An n$^+$-type source region 5 is formed in the surface layer of the semiconductor layer 3, and a trench 7 runs from the main surface through the region 5 and the semiconductor layer 3 reaching to the semiconductor layer 2, and extending approximately in the [11$\bar{2}$0] direction. An n-type silicon carbide semiconductor thin-film layer 8 is provided on the region 5, the semiconductor layer 3 and the semiconductor layer 2 on the side walls of the trench 7, while a gate electrode layer 10 is formed on the inner side of a gate insulating film 9, a source electrode layer 12 is formed on the surface of the semiconductor region 5, and a drain electrode layer 13 is formed on the surface of the n$^+$-type substrate 1.

4 Claims, 13 Drawing Sheets

ROUND TABLE

2 μm

[11$\bar{2}$0]
[10$\bar{1}$0]

SILICON CARBIDE SEMICONDUCTOR DEVICE AND PROCESS FOR ITS PRODUCTION

BACKGROUND OF THE INVENTION

1. Field of the Invention

The present invention relates to a silicon carbide semiconductor device, such as a high power vertical insulating gate-type field-effect transistor, and to a process for its production.

2. Description of the Related Art

In recent years vertical power MOSFETs have been designed which are constructed using silicon carbide single crystal materials as power transistors. Power transistors must have a low leakage current between the source and drain for gate voltage off-times, and a low resistance between the source and drain for on-times (on-resistance), and power transistors designed to effectively take advantage of the electronic characteristics of hexagonal crystal silicon carbide for reduced leakage current and reduced on resistance during periods of high-voltage application have been proposed in the form of the trench gate-type power MOSFET shown in FIGS. 1 and 2 (for example, Japanese Unexamined Patent Publication No. 7-131016) and the silicon carbide semiconductor device shown in FIG. 3 which is aimed at providing both reduced threshold voltage and increased breakdown voltage between the gate and drain and between the gate and source (for example, Japanese Patent Application No. 7-72026 by the present applicant).

Japanese Unexamined Patent Publication No. 7-131016 will be explained first. The trench gate-type power MOSFET shown in FIGS. 1 and 2 is constructed so that the current path flowing between the source and drain is parallel to plane {0001}, and the channel-forming plane 26 is in a direction parallel to plane {11$\bar{2}$0}.

The reason for this is that the effective mass of the electrons in the direction perpendicular to [0001], i.e. on plane {0001}, is about ⅓ that in the [0001] direction and the electron mobility on plane {0001} is therefore about 5 times the electron mobility in the [0001] direction, and thus when the current path is parallel to plane {0001}, it is possible to minimize the electrical resistance of the current. An atomic dangling bond is also present on the MOS channel-forming section, but the density differs depending on the planar orientation. A correlation is believed to exist between this atomic dangling bond density and the leakage current, and thus the leakage current is determined based on the planar orientation of the channel-forming plane. In JPP'016, plane {11$\bar{2}$0} with the minimum leakage current is used as the channel-forming plane.

The concrete construction shown in FIG. 2 has a semiconductor substrate 20 with the main surface facing plane {1$\bar{1}$00}, in which there are successively laminated an n$^+$-type wafer layer 21, an n -type drain layer 22 and a p-type well layer 23, with an n-type source layer 24 formed on a portion of the surface of the p-type well layer 23, and a trench 25 formed in the section where the n-type source layer 24 is formed. The trench 25 runs from the n-type source layer 24 through the p-type well layer 23 reaching to the n$^-$-type drain layer 22, and has a long thin rectangular parallelopiped shape which cuts perpendicular into the main surface. The trench 25 is formed so that the channel-forming plane 26 is plane {11$\bar{2}$0}. An insulating film 27 is formed to approximately cover the exposed side walls and bottom of the trench 25, and a gate electrode 28 is situated on the top side of the insulating film 27. Also, a drain electrode 29 is formed on the surface of the n$^+$-type wafer layer 21 and a source electrode 30 is formed over the surface of the p-type well layer 23 and a part of the surface of the n-type source layer 24 connecting with this surface.

The technique of Japanese Patent Application No. 7-72026 will now be explained. FIG. 3 shows a trench gate-type power MOSFET having a structure which makes use of dependency of the thermal oxidation film thickness on the plane orientation. The oxidation rate of the hexagonal crystal silicon carbide is highest on the (000$\bar{1}$) carbon face, and is about 5 times that of the plane perpendicular to the (000$\bar{1}$) carbon face. This characteristic can be used by making the (000$\bar{1}$) carbon face the main surface, and making the oxidation film thickness of the surface and trench bottom 36b thicker than the oxidation film thickness of the trench side walls 36a which is the channel-forming side, and thus with a single gate oxidation film-forming step it is possible to produce a trench gate-type power MOSFET with a lower gate threshold voltage and higher gate/drain and gate/source breakdown voltages.

The concrete construction in FIG. 3 has an n-type epitaxial layer 33 formed on an n-type silicon carbide semiconductor substrate 32 with its main surface on the (000$\bar{1}$) carbon face, a p-type epitaxial layer 34 formed on the n-type epitaxial layer 33, and an n-type source region 35 formed on a prescribed region of the p-type epitaxial layer 34. Also, a trench 36 is formed running through the n-type source region 35 and p-type epitaxial layer 34 reaching to the n-type epitaxial layer 33, with a gate electrode 38 formed in the trench 36 via a gate insulating film 37. An insulating film 39 is formed on the top side of the gate electrode 38, and a source electrode film 40 is formed on the n-type source region 35, including the area over the insulating film 39.

When forming the trench gate-type power MOSFETs shown in FIGS. 1, 2 and 3, however, the impurity concentration of the channel-forming side is common to the semiconductor regions (the p-type well layer 23 in FIG. 2 and the p-type epitaxial layer 34 in FIG. 3) and therefore they have necessarily had the same impurity concentration. Yet, in designing power MOSFETS, the impurity concentration and film thickness of the semiconductor regions (23, 34) are the major design parameters for determining the source/drain breakdown voltage, while the impurity concentration of the channel-forming side is the major design parameter for determining the gate threshold voltage and voltage drop in the channel. For power MOSFETs designed for high breakdown voltage, low on-resistance and lower threshold voltage, it is important that the device be designed such as to allow independent control of the impurity concentrations of the semiconductor regions (23, 34) and the channel-forming side, and therefore the inability to independently control the impurity concentrations of the semiconductor regions (23, 34) and the channel-forming side by conventional methods has presented a problem.

Trench gate-type power MOSFETs must have extremely minimal surface scattering by irregularities on the channel-forming side surface in order to avoid reduction in channel mobility. For this reason, the irregularities on the trench sides which form the MOS channel section must be reduced to a minimum. RIE (Reactive Ion Etching) is usually used as the method for forming trenches in single crystal semiconductor surfaces, but the RIE method also produces crystal defects near the trench surface by ion impact during etching, leaving the etched surface very irregular. Although the MOS channel section is then formed by a gate oxidation film-forming step, the crystal defects in the trench side sections and the surface irregularities, which result during the trench-forming step of the RIE method, remain even after the gate oxidation film-forming step, thus leading to such problems as impairment the characteristics of the MOS channel section, reduction in the channel mobility, reducing the gate oxidation film breakdown voltage, shortening of the lifetime of the gate oxidation film, and greater leakage current between the source and drain.

It is, therefore, an object of the present invention to provide a silicon carbide semiconductor device which has a lower gate threshold voltage, improved breakdown voltage between gate and source and between gate and drain and reduced leakage current during off-times, as well as even further reduced on-resistance and greater reliability of the gate oxidation film.

SUMMARY OF THE INVENTION

To attain the above object, the present invention provides a silicon carbide semiconductor device, comprising: a single crystal hexagonal silicon carbide semiconductor substrate comprising a stack of a first semiconductor layer of a first conductivity-type, a second semiconductor layer of the first conductivity-type having an electric resistance higher than that of said first semiconductor layer, and a third semiconductor layer of a second conductivity-type in this order, said third semiconductor layer having a main surface of a carbon face with a face orientation of about (000$\bar{1}$); a semiconductor region of the first conductivity-type formed in a predetermined region of said third semiconductor layer in a layer adjacent to said main surface of said third semiconductor layer; a trench extending from said main surface through said semiconductor region and said third semiconductor layer and reaching said second semiconductor layer, said trench having side walls extending in the direction of [11$\bar{2}$0]; a fourth semiconductor layer of silicon carbide extending on said side walls of said semiconductor region, said third semiconductor layer and said second semiconductor layer in said trench, said fourth semiconductor layer having a surface; a gate insulating film formed at least on said surface of said fourth semiconductor layer; a gate electrode layer formed inside said gate insulating film in said trench; a first electrode layer formed on at least a portion of said semiconductor region; and a second electrode layer formed on a surface of said first semiconductor layer (claim 1).

According to the present invention, the semiconductor substrate is single crystal hexagonal silicon carbide with a main surface of a carbon face with a face orientation of about (000$\bar{1}$) while the trench extends in the direction of about [11$\bar{2}$0], and a fourth semiconductor layer made of a silicon carbide thin-film is also situated on the sides of the trench. This construction is applied, forming a fourth semiconductor layer made of an impurity concentration-controlled silicon carbide thin-film in an epitaxial manner on the sides of the trench formed by etching followed by thermal oxidation of the surface thereof to form an MOS structure, to thus produce a channel in the fourth semiconductor layer for independent control of the impurity concentration of the channel-forming side and the impurity concentration of the third semiconductor layer, and thereby obtain a silicon carbide semiconductor device with high breakdown voltage, low on-resistance and a low threshold voltage. In particular, lowering the impurity concentration of the fourth semiconductor layer forming the channel results in less influence by impurity scattering while the carrier flows, thus providing greater channel mobility. In addition, since the source/drain breakdown voltage is largely governed by the impurity concentration and film thickness of the high-resistance semiconductor layer (second semiconductor layer) and third semiconductor layer, the impurity concentration of the third semiconductor layer may be raised while its film thickness is reduced, the channel length may be shortened while maintaining a high breakdown voltage characteristic, and thus the channel resistance may be reduced with reduction in the on-resistance between the source and drain. Furthermore, since the trench sides extend approximately in the [11$\bar{2}$0] direction, the channel-forming side made of the fourth semiconductor layer consisting of the silicon carbide thin-film may be in the [11$\bar{2}$0] direction, and thus irregularities in the channel-forming side may be vastly reduced. This has been confirmed by the present inventors by experiments on epitaxial growth of silicon carbide. The epitaxial growth of silicon carbide on the trench sides characteristically forms an extremely flat surface selectively in the [11$\bar{2}$0] direction, and therefore the MOS interface resulting from thermal oxidation of this surface is also flat, and the channel-forming side has less surface scattering of the carrier and the channel mobility may thus be drastically improved. In addition, the fourth semiconductor layer has no crystal defects resulting from ion impact with RIE, and thus loss of mobility may be prevented. The gate oxidation film thickness formed on the channel-forming side is also uniform, with no local electric field concentration, and therefore the gate oxidation film breakdown voltage is improved, providing a highly reliable silicon carbide semiconductor device with a longer gate oxidation film lifetime.

According to the invention of claim 2, the planar shape of the trench side walls is hexagonal with almost equal inner angles, and thus the angle formed by each of the inner angles of each side of the hexagon (adjacent sides) is about 120°. Thus, in addition to the function and effect of the invention of claim 1, when a high voltage is applied between the source and drain during off times, no avalanche breakdown occurs due to electric field concentration at the semiconductor sections formed by the trench with the hexagonal-shaped sides. Consequently, the design for breakdown voltage between the source and drain may be considered to be the breakdown voltage determined by the impurity concentration and film thickness of the high-resistance semiconductor layer (second semiconductor layer) and third semiconductor layer, to thus allow a high breakdown voltage design.

Thus, with the trench shape which not only utilizes the angle dependency of the oxidation rate of the hexagonal crystal silicon carbide with respect to plane {0001} and the angle dependency of the epitaxial growth rate with respect to plane {0001}, but also combines orientation dependency of the epitaxial growth rate within plane {0001}, it is possible to achieve a reduction in gate threshold voltage, improvement in the breakdown voltage between gate and source and between gate and drain and reduction in the leakage current during off times, as well as further reduction in the on resistance and improvement in the reliability of the gate oxidation film.

In accordance with the present invention, there is also provided a process for manufacturing a silicon carbide semiconductor device, comprising the steps of: epitaxially growing, on a first semiconductor layer of hexagonal single crystal silicon carbide of a first conductivity-type, a second semiconductor layer of the first conductivity-type having an electric resistance higher than that of said first semiconductor layer, and a third semiconductor layer of a second conductivity-type in this order, to form a hexagonal single crystal silicon carbide semiconductor substrate comprising the first to third semiconductor layers, said third semiconductor layer having a main surface of a carbon face with a face orientation of about (000$\bar{1}$); forming a semiconductor region of the first conductivity-type in a predetermined region of said third semiconductor layer in a layer adjacent to said main surface of said third semiconductor layer; forming a trench extending from said main surface through said semiconductor region and said third semiconductor layer and reaching said second semiconductor layer, said trench having side walls extending in the direction of [11 $\bar{2}$0]; growing a fourth semiconductor layer of silicon carbide entirely including on an inner surface of said trench, said fourth semiconductor layer having a thickness thicker on said side walls of said trench than in other regions; thermally oxidizing said fourth semiconductor layer so as to completely oxidize said fourth semiconductor layer other than a region on said side walls of said trench, the oxidized semiconductor layer having a thickness thicker on the bottom of said trench than on said side walls thereof, to thereby selectively leave said fourth semiconductor layer on said side walls of said trench and form a gate insulating layer on said fourth semiconductor layer in said trench; forming a gate electrode layer inside said gate insulating film in said trench; forming a first electrode layer on at least a portion of said semiconductor region; and forming a second electrode layer on a surface of said first semiconductor layer.

BRIEF DESCRIPTION OF THE DRAWINGS

FIGS. 21A and 21B are sketches illustrating the orientation of epitaxial growth of a silicon carbide semiconductor material within the (0001) plane, wherein FIG. 21A is a sketch of a Nomarski photograph before epitaxial growth and FIG. 21B is a sketch of a Nomarski photograph after epitaxial growth.

DETAILED DESCRIPTION OF THE PREFERRED EMBODIMENTS

The present invention will now be explained in greater detail.

The present inventors have discovered that the impurity concentration of the channel section may be controlled while forming a channel section with no defects due to ion impact, by forming an epitaxial growth film on the trench side walls after the step of forming the trench, and then forming a MOS channel section by a gate oxidation step. That is, by forming the semiconductor layer while controlling the concentration of impurities included in the semiconductor layer during the epitaxial growth, it is possible to independently control the impurity concentrations of the third semiconductor layer and the channel-forming side, and to form a channel section which is unaffected by defects near the trench side walls which are produced by the trench-forming step.

Figure 1:
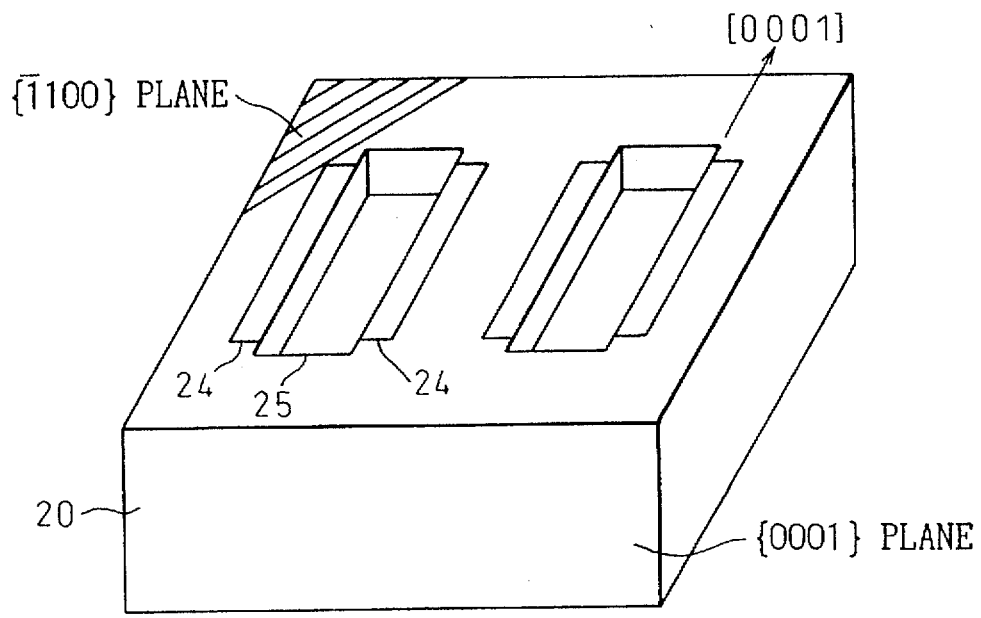
FIG. 1 is a perspective view of a field effect transistor of the prior art.
Figure 2:
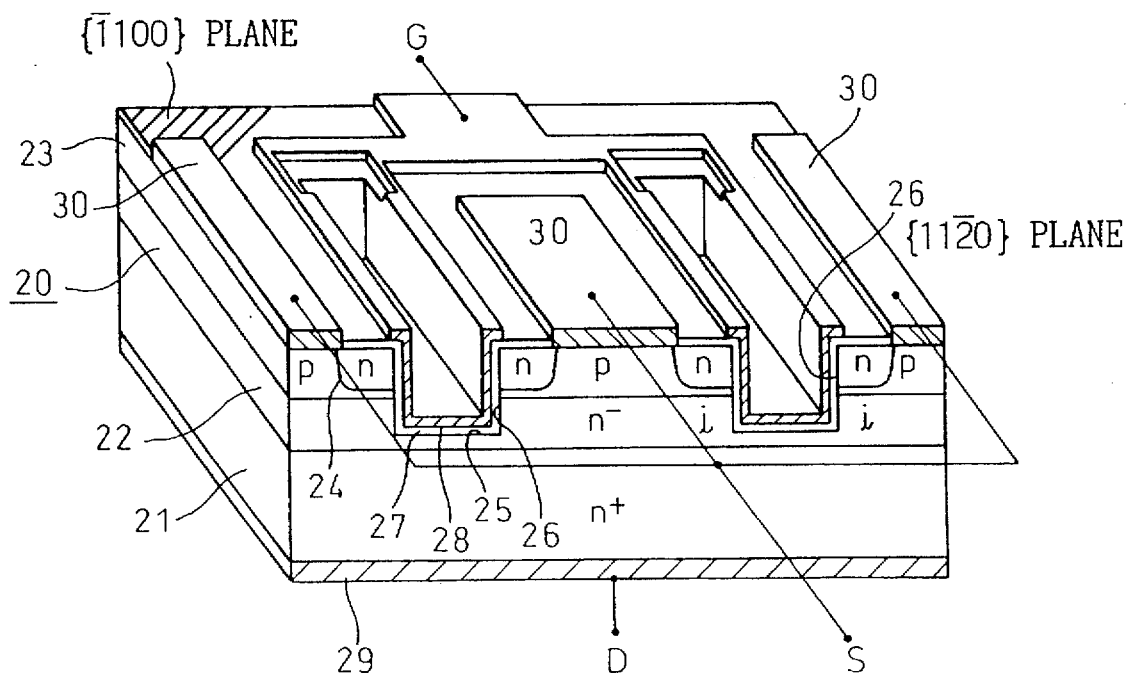
FIG. 2 is a perspective view of a field effect transistor of the prior art.
Figure 3:
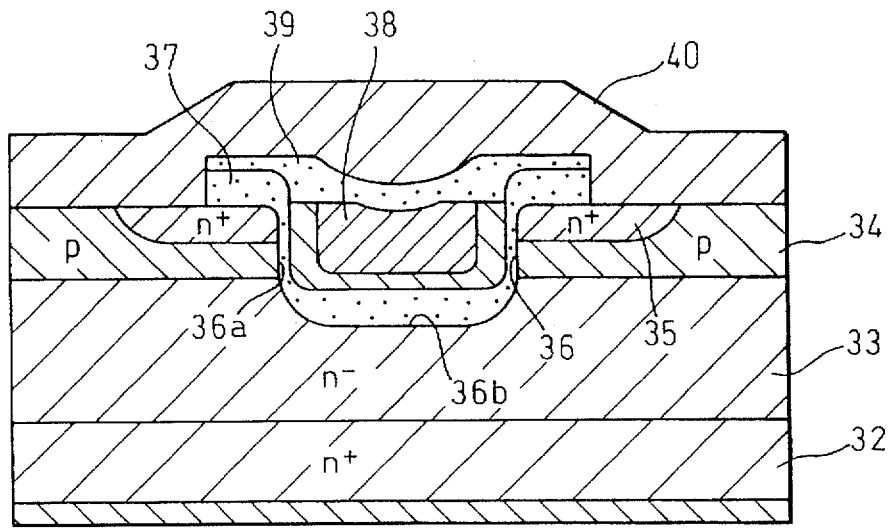
FIG. 3 is a cross-sectional view of a field effect transistor of the prior art.

In order to achieve this, a first impurity region (n-type source layer 24 in FIG. 2 and n-type source region 35 in FIG. 3) is formed in the third semiconductor layer, followed by formation of a trench and growth of an epitaxial layer on the inner walls of the trench, by which an epitaxial growth film is formed on the aforementioned trench side walls, because silicon carbide has a low thermal diffusion coefficient of impurities and thus a low degree of diffusion within a practical range. In other words, although silicon is impractical since it has a large thermal diffusion coefficient for impurities resulting in thermal diffusion of impurities during epitaxial growth, by which the first impurity region is excessively widened and impurities diffuse out of the substrate causing a considerable amount of so-called out diffusion, with silicon carbide on the other hand, a method may be used which takes advantage of the physical properties of silicon carbide.

Figure 20:
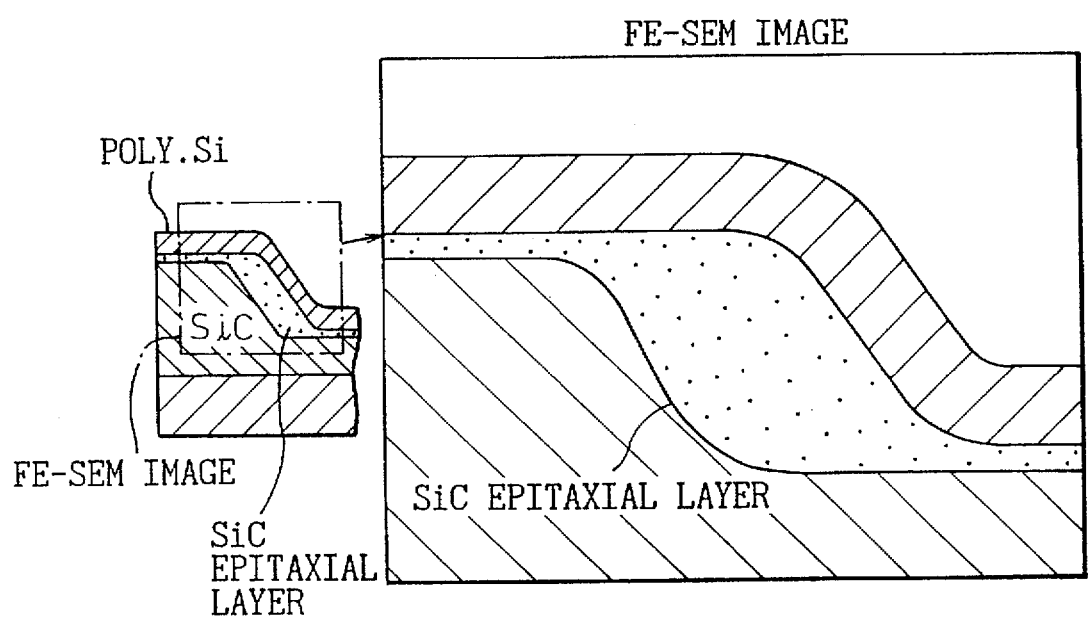
FIG. 20 is a sketch illustrating the orientation of epitaxial growth of a silicon carbide semiconductor material with respect to the (000$\bar{1}$) carbon face.

For the trench gate-type MOSFET to operate as a transistor, it is essential for the epitaxially grown semiconductor layer to remain only on the trench side walls, and this may be achieved by a combination of plane orientation dependency of the epitaxial growth rate and plane direction dependency of the oxidation rate. That is, compared to the (000$\bar{1}$) carbon face, the epitaxial growth rate in the direction perpendicular thereto is over about 10 times greater, and by making the main face on the (000$\bar{1}$) carbon face it is possible to form a semiconductor layer which is thick on the trench side walls and thin on the substrate surface and trench bottom. Referring to the experimental results by the present inventors, FIG. 20 is a sketch of an SEM image in the region including the side walls and bottom of the trench, which confirms that compared to (000$\bar{1}$) carbon face, the film thickness is over about 10 times larger in the direction perpendicular thereto.

After the semiconductor layer has been formed on the trench side walls in this manner, a thermal oxidation step is used to form a thermal oxidation film which is thin on the trench side walls and thick on the substrate surface and trench bottom, and the semiconductor layer formed by epitaxial growth on the substrate surface and trench bottom is thermally oxidized at this time into an oxide film. The thermal oxidation film is formed thin on the trench side walls and thick on the substrate surface and trench bottom because the oxidation rate of hexagonal crystal silicon carbide is fastest in the (000$\bar{1}$) carbon face, being about 5 times that in the direction perpendicular to the (000$\bar{1}$) carbon face.

Thus, a semiconductor layer may be left only on the trench side walls by thermal oxidation whereby the parts of the epitaxially grown semiconductor layer which are on the substrate surface and trench bottom are completely converted to oxide films.

When an SiC single crystal thin-film is formed on the trench side walls by epitaxial growth, it is apparent that there is not only angle dependency with respect to plane {0001}, but also growth rate anisotropy with respect to the direction on plane {0001}. For example, according to T. Kimoto and H. Matsunami: "Two-dimensional nucleation and step dynamics in crystal growth of SiC", Silicon Carbide and Related Materials, Ins. Phys. Conf. Ser. No. 137, Institute of Physics Publishing, Bristol and Philadelphia, pp.55–58

Figure 21A:
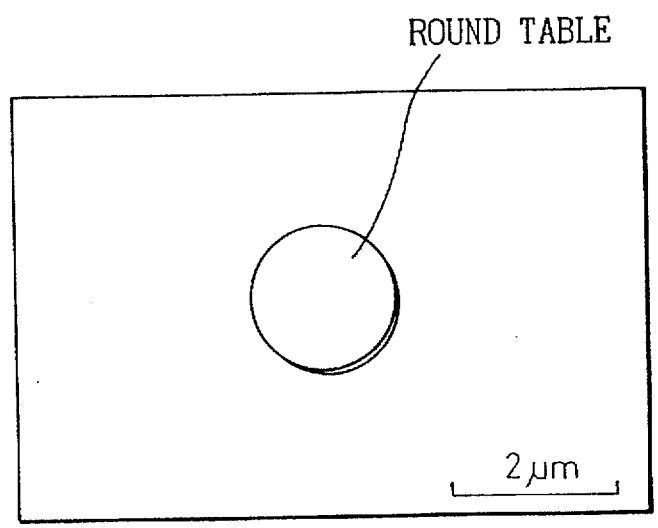
Figure 21B:
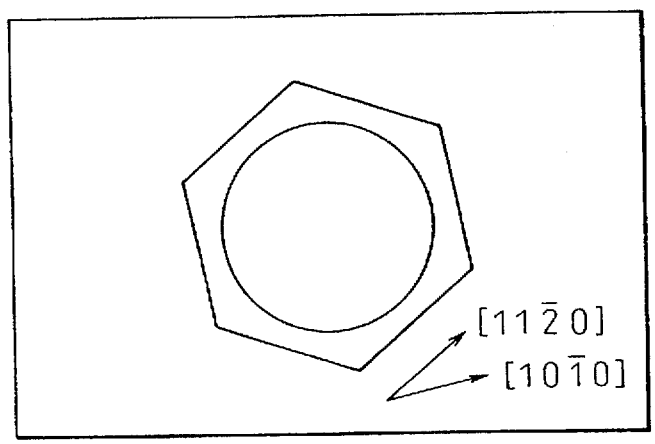

(1993), the epitaxial growth rate is fastest in [11$\bar{2}$0] and slowest in [1$\bar{1}$00], and therefore growth occurs selectively in the [11$\bar{2}$0] direction. That is, as shown in FIGS. 21A and 21B, when epitaxial growth occurs on a sample of a round mesa-type table formed on a wafer surface, the round mesa-type table shown in FIG. 21A becomes the hexagonal mesa-type table in FIG. 21B, due to growth rate anisotropy on plane {0001}. Here, the hexagonal sides extend in the direction of [11$\bar{2}$0]. The present invention is based on this observation, to realize a trench gate-type power MOSFET provided with a trench-type channel structure, which is satisfactory in terms of both construction and electrical characteristics.

This embodiment of the invention will now be explained with reference to the drawings.

Figure 4:
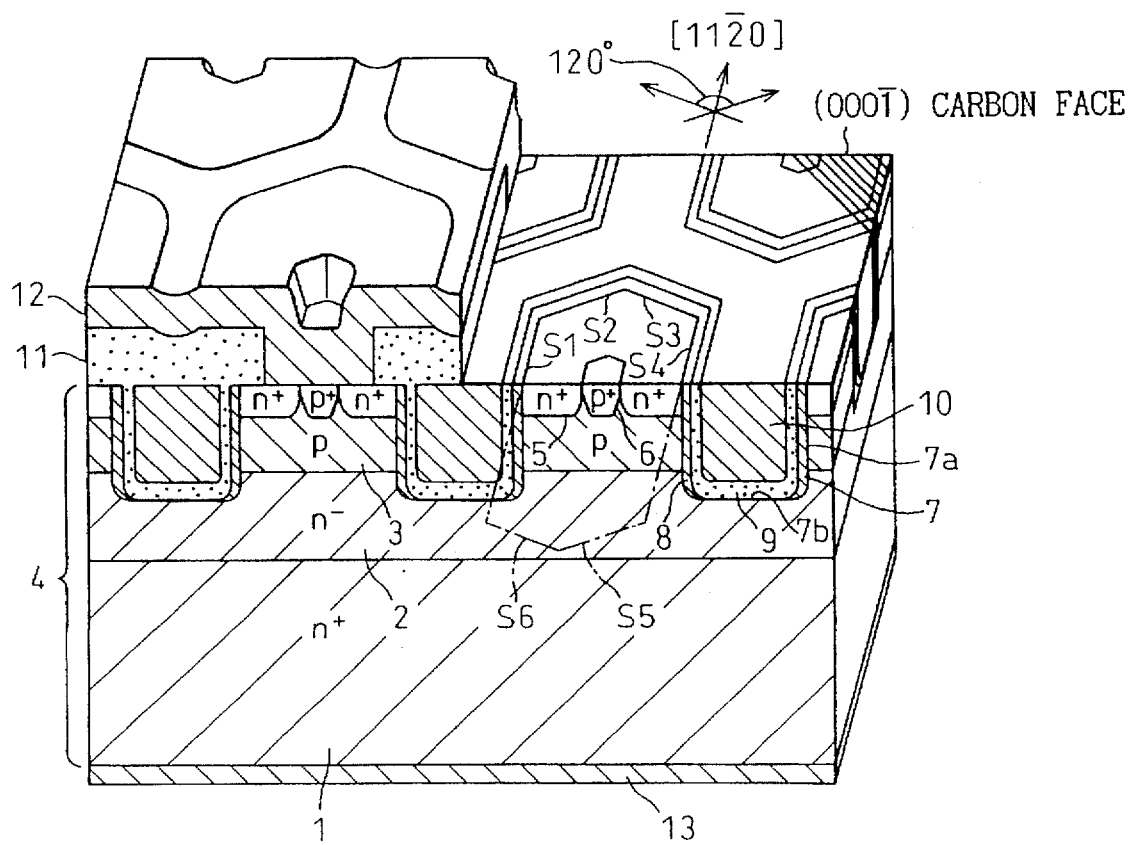
FIG. 4 is a perspective view for illustration of an embodiment of an n-channel trench gate-type power MOSFET.

FIG. 4 shows an n-channel trench gate-type power MOSFET (vertical-type power MOSFET) according to the present embodiment. The n-type silicon carbide semiconductor substrate 1 as the low-resistance semiconductor layer is made of hexagonal crystal silicon carbide. This $n^+$-type silicon carbide semiconductor substrate 1 is laminated in order with an $n^-$-type silicon carbide semiconductor layer 2 and a p-type silicon carbide semiconductor layer 3 as high-resistance semiconductor layers. Thus, there is formed a single crystal silicon carbide semiconductor substrate 4 consisting of an $n^+$-type silicon carbide semiconductor substrate 1, an $n^-$-type silicon carbide semiconductor layer 2 and a p-type silicon carbide semiconductor layer 3, the top side of which is the (000$\bar{1}$) carbon face.

In a prescribed area on the surface section within the p-type silicon carbide semiconductor layer 3 there is formed an $n^+$-type source region 5 as a semiconductor region. Also, in a prescribed area on the surface section within the p-type silicon carbide semiconductor layer 3 there is formed a low-resistance p-type silicon carbide region 6. A trench 7 is formed in a prescribed area of the $n^+$-type source region 5, and this trench 7 runs through the $n^+$-type source region 5 and the p-type silicon carbide semiconductor layer 3 reaching to the n -type silicon carbide semiconductor layer 2. The trench 7 has side walls 7a perpendicular to the surface of the semiconductor substrate 4 and a bottom 7b parallel to the surface of the semiconductor substrate 4. The side walls 7a of the trench 7 extend approximately along the direction of [11$\bar{2}$0]. The planar shape of the side walls 7a of the trench 7 is hexagonal with almost equal inner angles. That is, as shown in the plane view of the substrate 4 in FIG. 5, the six sides of the hexagon, indicated by S1, S2, S3, S4, S5 and S6, form angles of approximately 120° as the (inner) angle between sides S1 and S2, the (inner) angle between sides S2 and S3, the (inner) angle between sides S3 and S4, the (inner) angle between sides S4 and S5, the (inner) angle between sides S5 and S6, and the (inner) angle between sides S6 and S1.

On the surface of the $n^+$-type source region 5, the p-type silicon carbide semiconductor layer 3 and the $n^-$-type silicon carbide semiconductor layer 2 on the side walls 7a of the trench in FIG. 4, there extends an n-type silicon carbide semiconductor thin-film layer 8 as a second semiconductor layer. The n-type silicon carbide semiconductor thin-film layer 8 is a thin-film with a thickness of about 1000–5000 Å, and the crystal structure (Poly-type) of the n-type silicon carbide semiconductor thin-film layer 8 is the same as the crystal structure (Poly-type) of the p-type silicon carbide semiconductor layer 3, such as, for example, 6H-SiC. It may also be 4H-SiC, or 3C-SiC. The impurity concentration of the n-type silicon carbide semiconductor thin-film layer 8 is preferably lower than the impurity concentration of the $n^+$-type silicon carbide semiconductor substrate 1 and $n^+$-type source region 5.

Also, in the trench, a gate insulating film 9 is formed on the surface of the n-type silicon carbide semiconductor thin-film layer 8 and the bottom 7b of the trench. The inside of the gate insulating film 9 in the trench 7 is filled with a gate electrode layer 10. The gate electrode layer 10 is covered with an insulating film 11. A source electrode layer 12 is formed on the surface of the $n^+$-type source region 5 and the surface of the low-resistance p-type silicon carbide region 6, as a first electrode layer. On the surface of the $n^+$-type silicon carbide semiconductor substrate 1 (the back side of the semiconductor substrate 4) there is formed a drain electrode layer 13 as a second electrode layer.

Thus, the trench gate-type power MOSFET has the channel-forming side in the [11$\bar{2}$0] direction.

The production steps for the trench gate-type power MOSFET will now be explained with reference to FIGS. 6 to 12.

Figure 6:
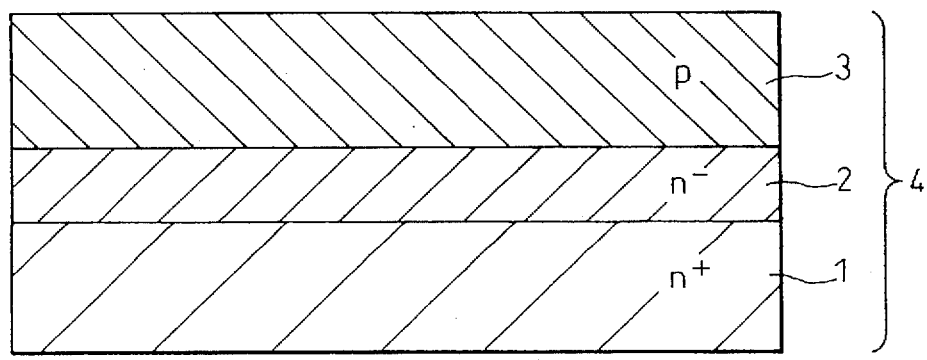
FIGS. 6 to 12 are cross-sectional views for illustration of a production process for an n-channel trench gate-type power MOSFET.

First, as shown in FIG. 6, an $n^+$-type silicon carbide semiconductor substrate 1 is prepared having the main surface on about the (000$\bar{1}$) carbon face, and on the surface thereof there is epitaxially grown an $n^-$-type silicon carbide semiconductor layer 2, after which a p-type silicon carbide semiconductor layer 3 is epitaxially grown on the $n^-$-type silicon carbide semiconductor layer 2.

Thus is formed a semiconductor substrate 4 consisting of an $n^+$-type silicon carbide semiconductor substrate 1, an $n^-$-type silicon carbide semiconductor layer 2 and a p-type silicon carbide semiconductor layer 3.

Figure 7:
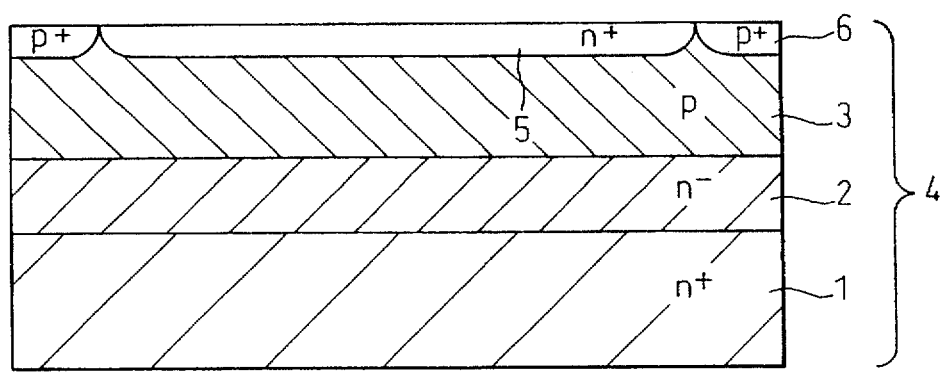

Next, as shown in FIG. 7, an $n^+$-type source region 5 is formed on a prescribed area of the surface layer of the p-type silicon carbide semiconductor layer 3 by, for example, nitrogen ion injection. Also, a low-resistance p-type silicon carbide region 6 is formed on another prescribed area of the surface layer of the p-type silicon carbide semiconductor layer 3 by, for example, aluminum ion injection.

Figure 5:
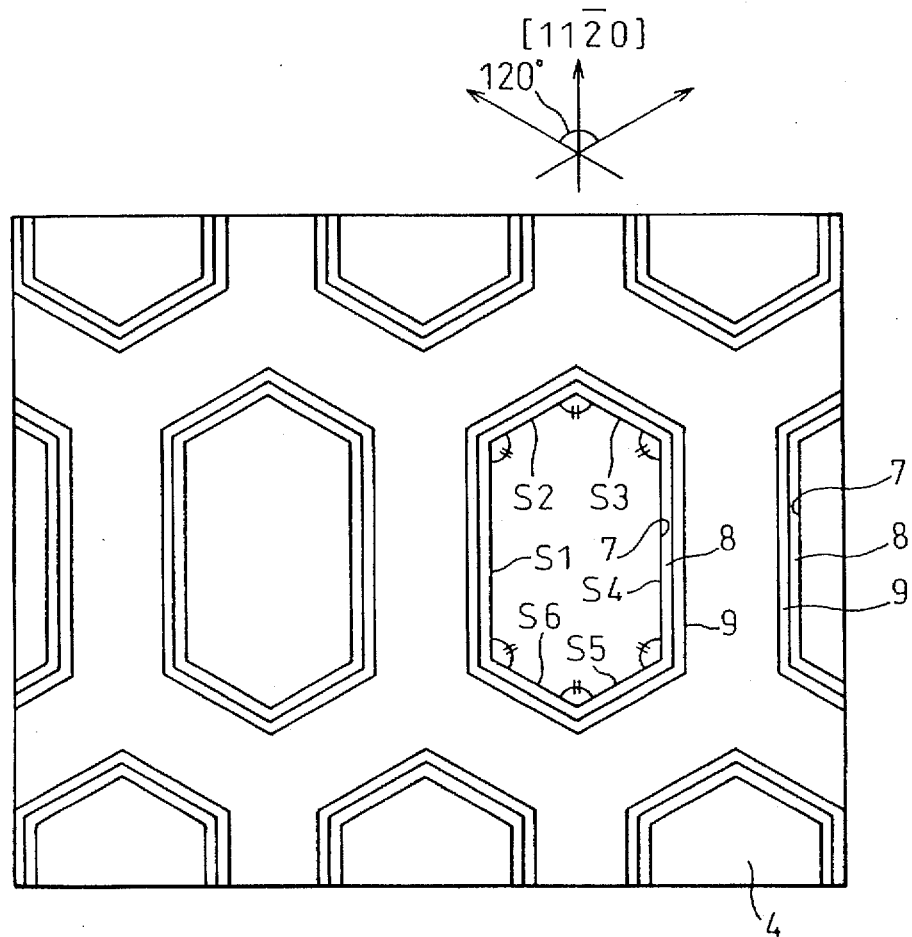
FIG. 5 is a cross-sectional view of a substrate.
Figure 8:
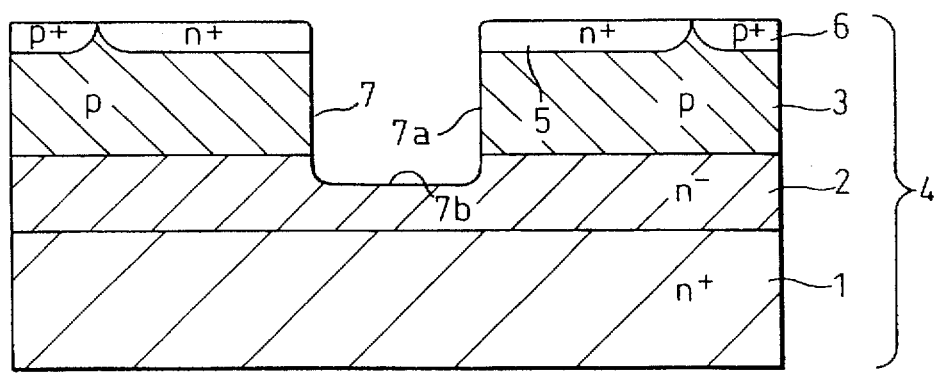

Then, as shown in FIG. 8, a dry etching method (RIE) is used to form a trench 7 through both the $n^+$-type source region 5 and the p-type silicon carbide semiconductor layer 3 reaching to the $n^-$-type silicon carbide semiconductor layer 2. The trench 7 is formed so that the side walls 7a extend in the [11$\bar{2}$0] direction. Therefore, the planar shape of the side walls 7a of the trench 7 is hexagonal with almost equal inner angles, as shown in FIG. 5.

Figure 9:
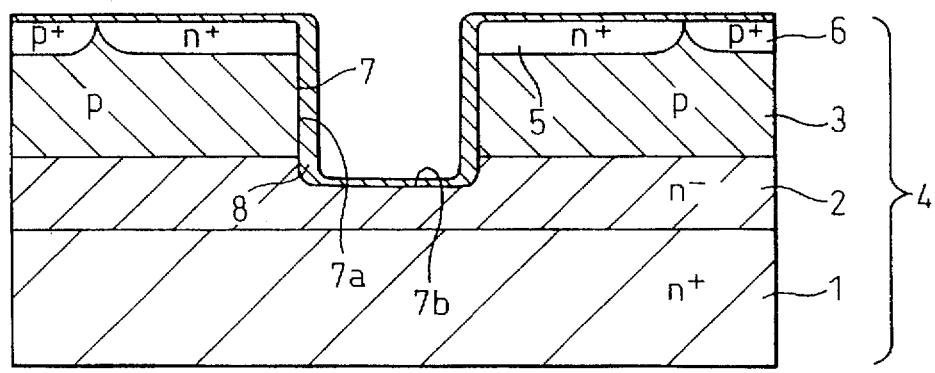

Then, as shown in FIG. 9, an n-type silicon carbide semiconductor thin-film layer 8 is formed by an epitaxial growth method on the top of the semiconductor substrate 4 including the inner walls of the trench 7 (the side walls 7a and the bottom 7b). That is, the n-type silicon carbide semiconductor thin-film layer 8 is formed extending across the $n^+$-type source region 5, p-type silicon carbide semiconductor layer 3 and $n^-$-type silicon carbide semiconductor layer 2 on the inner walls of the trench 7. Since the epitaxial growth rate at this time compared to the (000$\bar{1}$) carbon face is over 10 times greater in the direction perpendicular thereto, the thin-film layer 8 is formed thicker at the trench side walls 7a and thinner at the trench bottom 7b. The impurity concentration of the n-type silicon carbide semiconductor thin-film layer 8 on the trench side walls 7a is preferably set so as to be lower than the impurity concentration of the $n^+$-type silicon carbide semiconductor substrate 1 and $n^+$-type source region 5. As a more concrete method of forming the n-type silicon carbide semiconductor thin-film layer 8, CVD is used for epitaxial growth of an 6H-SiC thin-film layer 8 on 6H-SiC.

In the step of forming the n-type silicon carbide semiconductor thin-film layer 8, growth occurs with selective formation in the [11$\bar{2}$0] direction which is characteristic of epitaxial growth of silicon carbide, i.e. with reduced surface irregularities produced by the trench-forming step. Hence, the channel-forming side is extremely flat and thus channel mobility is drastically improved. Also, since no crystal defects due to ion impact by RIE are present in the n-type silicon carbide semiconductor thin-film layer 8, reduction in mobility may be reduced, and the on-resistance between the source and drain may also be reduced.

Figure 10:
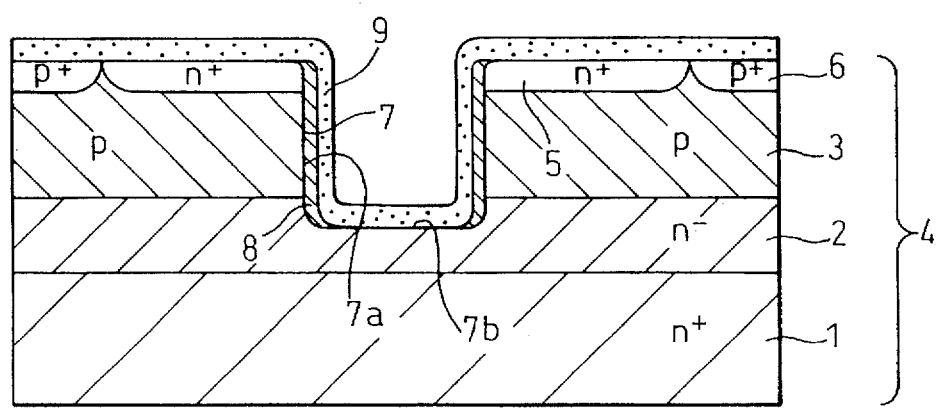

Next, as shown in FIG. 10, thermal oxidation is used to form a gate insulating film (thermal oxidation film) 9 on the surface of the semiconductor substrate 4 and n-type silicon carbide semiconductor thin-film layer 8, and on the bottom 7b of the trench. At this time, the thermal oxidation film (9) is thinner at the trench side walls 7a and thicker at the substrate surface and trench bottom 7b, and the semiconductor thin-film layer 8 formed by epitaxial growth on the surface of the substrate 4 and the trench bottom 7b becomes an oxide layer. This is because the oxidation rate of the hexagonal crystal silicon carbide is fastest in the (000$\bar{1}$) carbon face, being about 5 times that in the direction perpendicular to the (000$\bar{1}$) carbon face. Thus, the semiconductor thin-film layer 8 is left only on the trench side walls since the semiconductor thin-film layer 8 which is the part of the epitaxially grown n-type silicon carbide semiconductor thin-film layer 8 on the surface of the substrate 4 and the trench bottom 7b is thermally oxidized.

Since the above-mentioned channel-forming side is extremely flat in the step of forming the gate insulating film 9, it is possible to obtain a uniform thickness of the gate insulating film (gate oxidation film) formed on the channel-forming side. As a result, the completed MOSFET has no local areas of electric field concentration upon application of the gate voltage, and thus no local electric field concentration is generated. This provides an improved breakdown voltage of the gate oxidation film. For the same reason, the reliability of the gate oxidation film is also extended.

Figure 11:
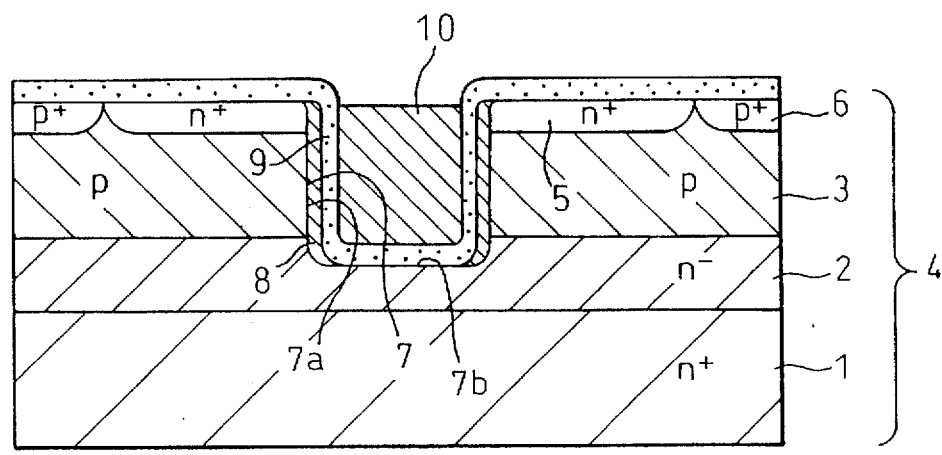
Figure 12:
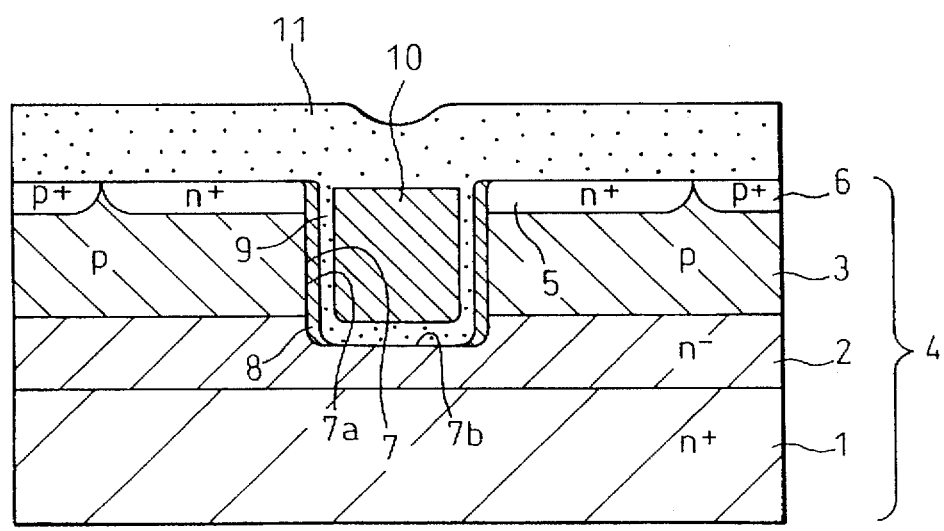

Also, as shown in FIG. 11, the inside of the gate insulating film 9 in the trench 7 is filled with a gate electrode layer 10. As shown in FIG. 12, an insulating film 11 is formed over the gate electrode layer 10. Then, as shown in FIG. 4, a source electrode layer 12 is formed on the n$^+$ source region 5 and low-resistance p-type silicon carbide region 6 including the section over the insulating film 11. A drain electrode layer is then formed on the surface of the n$^+$-type silicon carbide semiconductor substrate 1 to complete the trench gate-type power MOSFET.

This embodiment has the following features (A) and (B).

(A) Using hexagonal crystal silicon carbide with the main surface on approximately the (000$\bar{1}$) carbon face as the semiconductor substrate 4, providing a trench 7 whose side walls 7a extend in approximately the [11$\bar{2}$0] direction, and having an n-type silicon carbide semiconductor thin-film layer 8 with a controlled impurity concentration situated on the side walls 7a of the trench 7, it is possible to independently control the impurity concentration of the channel-forming side and the impurity concentration of the p-type silicon carbide semiconductor layer 3 (p-type epitaxial layer) to provide a silicon carbide semiconductor device with high breakdown voltage, low on resistance and low threshold voltage, and especially by lowering the impurity concentration of the n-type silicon carbide semiconductor thin-film layer 8 forming the channel, it is possible to minimize the effect of impurity diffusion during flow of the carrier and thus increase the channel mobility. In addition, since the breakdown voltage between the source and drain is governed mainly by the impurity concentration and film thickness of the n$^-$-type silicon carbide semiconductor layer 2 and p-type silicon carbide semiconductor layer 3, the impurity concentration of the p-type silicon carbide semiconductor layer 3 may be increased with a thinner film thickness of the p-type silicon carbide semiconductor layer 3, so that the channel length may be shortened while maintaining high breakdown voltage characteristics, and thus the channel resistance may be lowered and the on-resistance between the source and drain may be reduced. In addition, since the side walls 7a of the trench 7 extend in approximately the direction of [11$\bar{2}$0], the channel-forming side consisting of the n-type silicon carbide semiconductor thin-film layer 8 may be oriented in the [11$\bar{2}$0] direction, and irregularities in the channel-forming side may be greatly minimized. As a result it is possible to achieve a lower gate threshold voltage, improved gate/source breakdown voltage and gate/drain breakdown voltage and reduced leakage current at off times, as well as reduced on-resistance and improved reliability of the gate oxidation film.

(B) The planar shape of the side walls 7a of the trench 7 is hexagonal with almost equal inner angles, with the sides of the hexagon forming inner angles of about 120°, and therefore when a high voltage is applied between the source and drain during off times, no avalanche breakdown occurs due to electric field concentration at the semiconductor sections formed by the trench 7 with the hexagonal-shaped sides; thus, in the design of the device the breakdown voltage between the source and drain may be considered to be the breakdown voltage determined by the impurity concentration and film thickness of the n$^-$-type silicon carbide semiconductor layer 2 and the p-type silicon carbide semiconductor layer 3, to thus allow a high breakdown voltage design.

In addition to the construction described so far, for example, the source electrode layer 12 formed on the n$^+$-type source region 5 and the low-resistance p-type silicon carbide region 6 may be made of different materials. The low-resistance p-type silicon carbide region 6 may also be omitted, in which case the source electrode layer 12 is formed in contact with the n$^+$-type source region 5 and the p-type silicon carbide semiconductor layer 3. The source electrode layer 12 needs to be formed at least on the surface of the n$^+$-type source region 5.

Furthermore, although the embodiment described above relates to application for an n-channel vertical-type MOSFET, the same effect is achieved with a p-channel vertical-type MOSFET wherein the p-type and n-type in FIG. 4 are switched.

Figure 13:
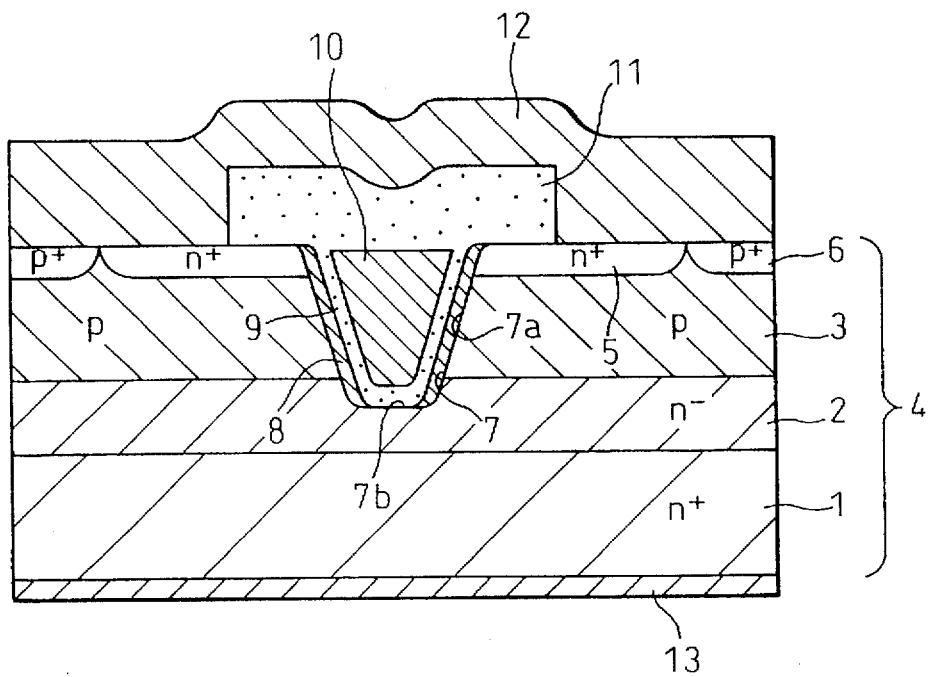
FIGS. 13 to 18 are cross-sectional schematic views for illustration of working examples of n-channel trench gate-type power MOSFETs.
Figure 14:
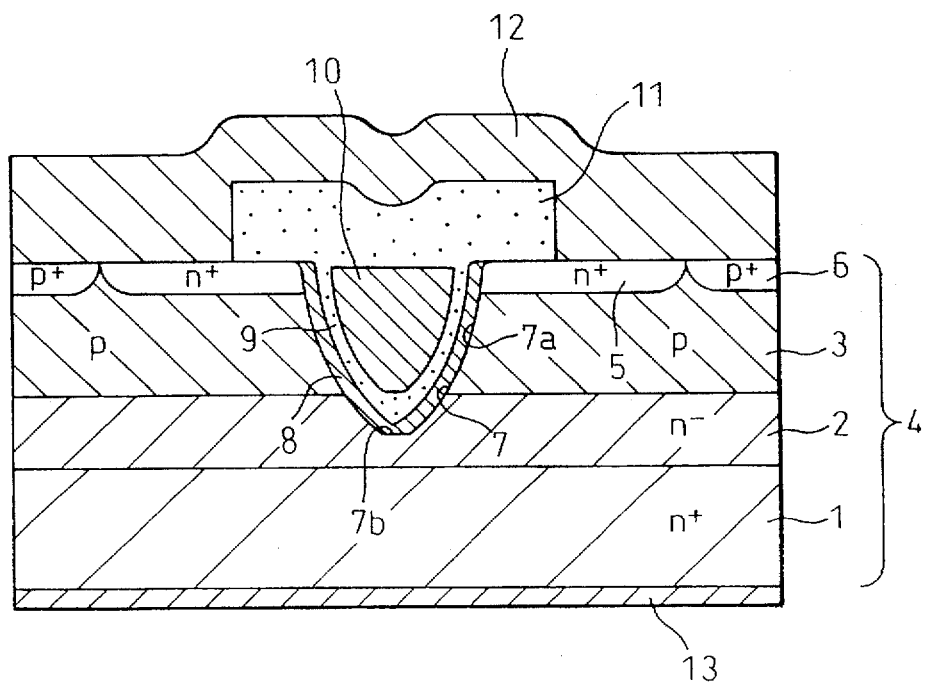

Also, although in FIG. 4 the trench 7 has side walls 7a oriented at roughly 90° with respect to the substrate surface, the angle formed between the side walls 7a of the trench 7 and the substrate surface does not necessarily need to be near 90°, as shown in FIG. 13. The trench 7 may also be V-shaped without a bottom. Alternatively, as shown in FIG. 14, the side walls 7a of the trench 7 do not have to extend linearly, and may form a smooth curve instead.

The angle formed between the side walls 7a of the trench 7 and the substrate surface may be designed for greater channel mobility, for a more pronounced effect.

Figure 15:
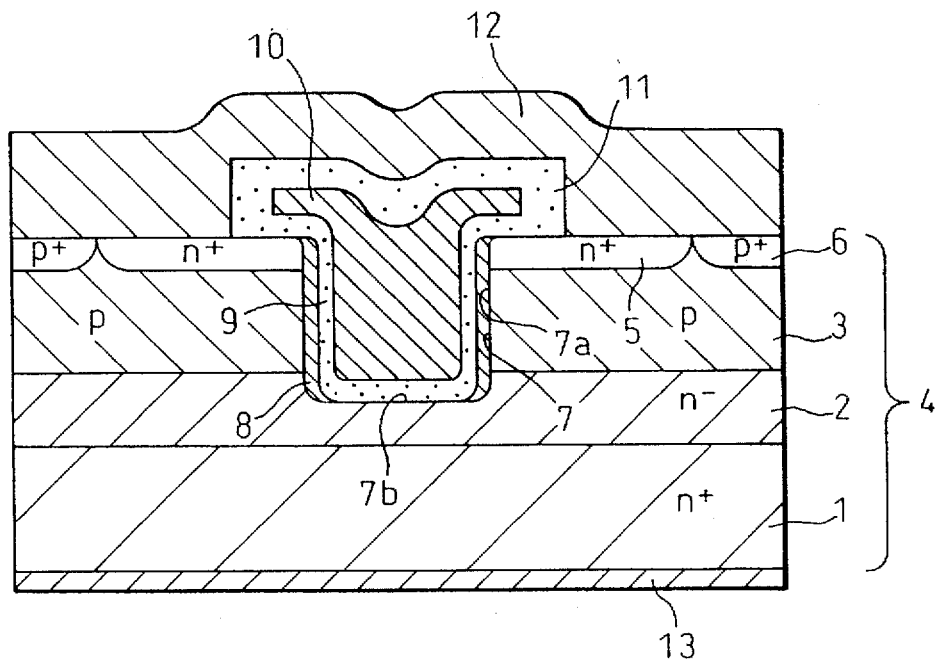

Also, as shown in FIG. 15, the top section of the gate electrode layer 10 may also be of a shape which extends over the n$^+$-type source region 5. With this construction, it is possible to reduce the connection resistance between the n⁺-type source region 5 and the channel induced in the n-type silicon carbide semiconductor thin-film layer 8.

Figure 16:
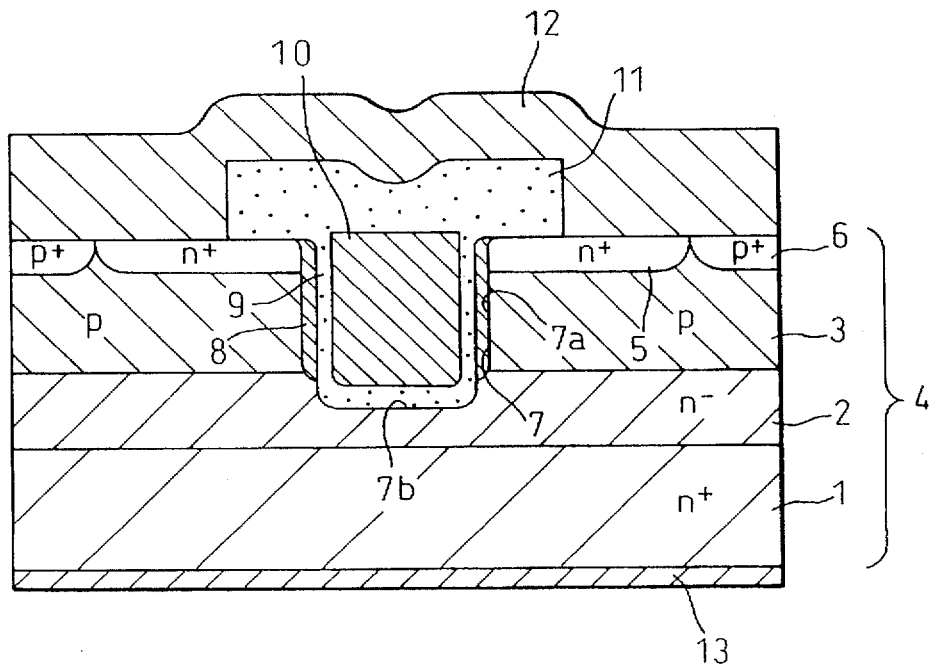

Furthermore, as shown in FIG. 16, the thickness of the gate insulation film 9 may also be roughly equal at the center and lower end of the n-type silicon carbide semiconductor thin-film layer 8 which forms the channel, with the gate electrode layer 10 reaching from the lower end to the bottom of the n-type silicon carbide semiconductor thin-film layer 8. With this construction it is possible to reduce the connection resistance between the channel induced in the n-type silicon carbide semiconductor thin-film layer 8 and the drain region.

Figure 17:
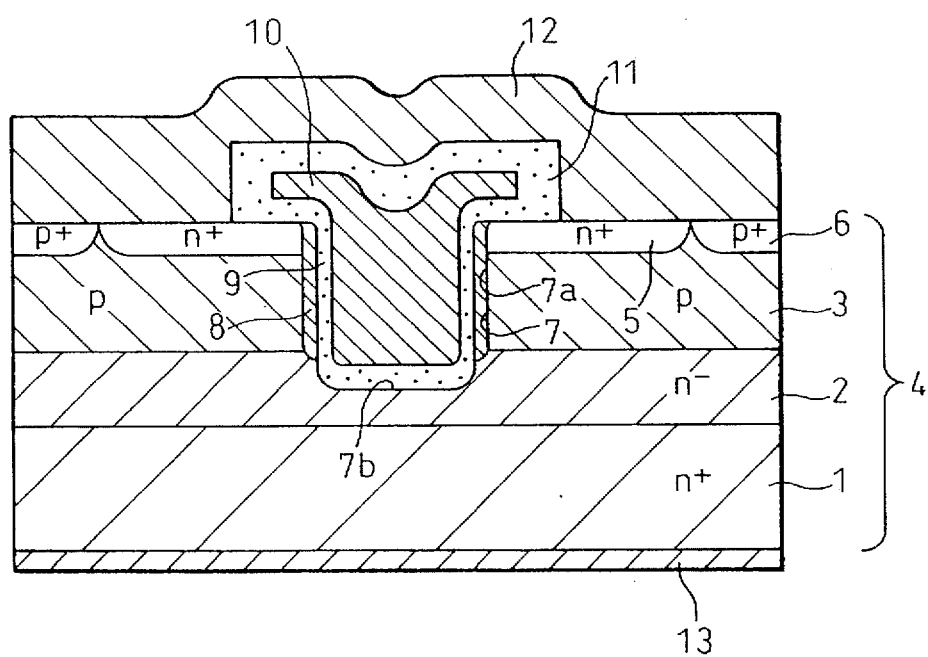

The design shown in FIG. 17 may also be used. That is, the construction may be such that, as in FIG. 15, the top section of the gate electrode layer 10 is of a shape which extends over the n⁺-type source region 5, while as in FIG. 16 the gate electrode layer 10 also extends below the lower end of the n-type silicon carbide semiconductor thin-film layer 8.

The n-type silicon carbide semiconductor thin-film layer 8 and the p-type silicon carbide semiconductor layer 3 may be of different crystal structures (poly-types) and, for example, providing a p-type silicon carbide semiconductor layer 3 of 6H-SiC and an n-type silicon carbide semiconductor thin-film layer 8 of 4H-SiC to increase the mobility in the direction of the carrier flow will give a MOSFET with low current loss.

In the embodiments described above, the thin-film layer grown on the trench side walls, i.e. the n-type silicon carbide semiconductor thin-film layer 8, is an n-type, but the thin-film layer grown on the trench side walls may be a p-type instead of an n-type. In the case of a p-type, the construction shown in FIG. 17 is preferred, wherein the top section of the gate electrode layer 10 is of a shape which extends over the n⁺-type source region 5 and the gate electrode layer 10 also extends below the lower end of the thin-film layer which is grown on the trench side walls.

Figure 18:
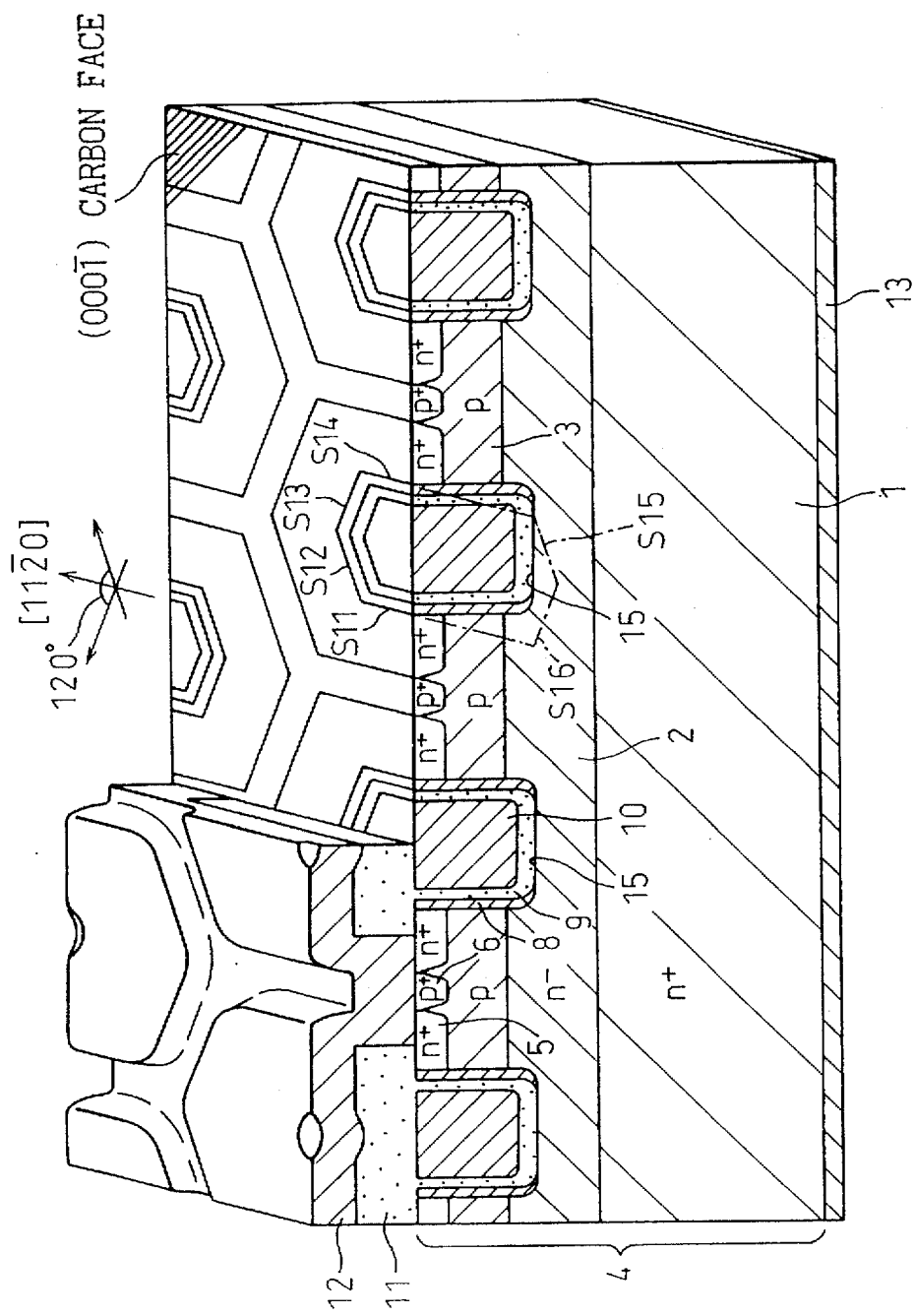
Figure 19:
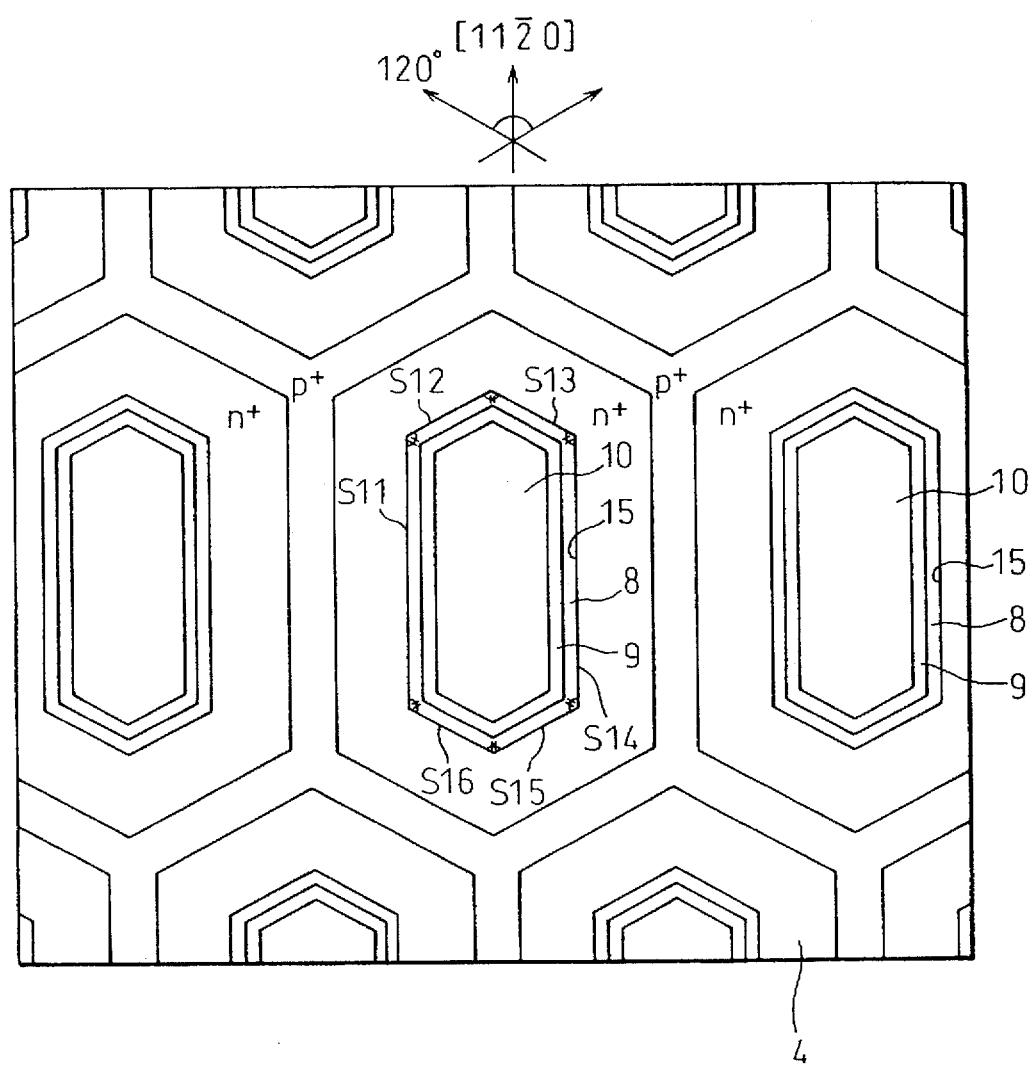
FIG. 19 is a plane view of a substrate for illustration of a working example.

In addition, as shown in FIG. 18, the planar shape of the side walls of the trench 15 (specifically, the shape on the gate electrode layer 10 side) may be hexagonal with almost equal inner angles. That is, in the plan view of the substrate 4 in FIG. 19, the six sides of the hexagon, indicated by S11, S12, S13, S14, S15 and S16, form angles of approximately 120° as the (inner) angle between sides S11 and S12, the (inner) angle between sides S12 and S13, the (inner) angle between sides S13 and S14, the (inner) angle between sides S14 and S15, the (inner) angle between sides S15 and S16, and the (inner) angle between sides S16 and S11.

We claim:

1. A silicon carbide semiconductor device, comprising:

a single crystal hexagonal silicon carbide semiconductor substrate comprising a stack of a first semiconductor layer of a first conductivity-type, a second semiconductor layer of the first conductivity-type having an electric resistance higher than that of said first semiconductor layer, and a third semiconductor layer of a second conductivity-type in this order, said third semiconductor layer having a main surface of a carbon face with a face orientation of about $(000\bar{1})$;

a semiconductor region of the first conductivity-type formed in a predetermined region of said third semiconductor layer in a layer adjacent to said main surface of said third semiconductor layer;

a trench extending from said main surface through said semiconductor region and said third semiconductor layer and reaching said second semiconductor layer, said trench having side walls extending in the direction of $[11\bar{2}0]$;

a fourth semiconductor layer of silicon carbide extending on said side walls of said semiconductor region, said third semiconductor layer and said second semiconductor layer in said trench, said fourth semiconductor layer having a surface;

a gate insulating film formed at least on said surface of said fourth semiconductor layer;

a gate electrode layer formed inside said gate insulating film in said trench;

a first electrode layer formed on at least a portion of said semiconductor region; and a second electrode layer formed on a surface of said first semiconductor layer.

2. The silicon carbide semiconductor device according to claim 1, wherein said trench has a planar shape of a hexagon with almost equal inner angles formed by said side walls thereof.

3. The silicon carbide semiconductor device according to claim 1, wherein said fourth semiconductor layer has an impurity concentration lower than those of said first and third semiconductor layers.

4. A process for manufacturing a silicon carbide semiconductor device, comprising the steps of:

epitaxially growing, on a first semiconductor layer of hexagonal single crystal silicon carbide of a first conductivity-type, a second semiconductor layer of the first conductivity-type having an electric resistance higher than that of said first semiconductor layer, and a third semiconductor layer of a second conductivity-type in this order, to form a hexagonal single crystal silicon carbide semiconductor substrate comprising the first to third semiconductor layers, said third semiconductor layer having a main surface of a carbon face with a face orientation of about $(000\bar{1})$;

forming a semiconductor region of the first conductivity-type in a predetermined region of said third semiconductor layer in a layer adjacent to said main surface of said third semiconductor layer;

forming a trench extending from said main surface through said semiconductor region and said third semiconductor layer and reaching said second semiconductor layer, said trench having side walls extending in the direction of $[11\bar{2}0]$;

growing a fourth semiconductor layer of silicon carbide entirely including on an inner surface of said trench, said fourth semiconductor layer having a thickness thicker on said side walls of said trench than in other regions;

thermally oxidizing said fourth semiconductor layer so as to completely oxidize said fourth semiconductor layer other than a region on said side walls of said trench, the oxidized semiconductor layer having a thickness thicker on the bottom of said trench than on said side walls thereof, to thereby selectively leave said fourth semiconductor layer on said side walls of said trench and form a gate insulating layer on said fourth semiconductor layer in said trench;

forming a gate electrode layer inside said gate insulating film in said trench;

forming a first electrode layer on at least a portion of said semiconductor region; and forming a second electrode layer on a surface of said first semiconductor layer.

* * * * *